United States Patent
Saito et al.

(10) Patent No.: US 10,173,546 B2
(45) Date of Patent: Jan. 8, 2019

(54) IN-VEHICLE DC-DC CONVERTER

(71) Applicant: Mitsubishi Electric Corporation, Chiyoda-ku, Tokyo (JP)

(72) Inventors: Hiroyuki Saito, Tokyo (JP); Hideaki Tani, Tokyo (JP); Satoshi Wachi, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 154 days.

(21) Appl. No.: 15/503,467

(22) PCT Filed: Oct. 28, 2014

(86) PCT No.: PCT/JP2014/078545
§ 371 (c)(1),
(2) Date: Feb. 13, 2017

(87) PCT Pub. No.: WO2016/067353
PCT Pub. Date: May 6, 2016

(65) Prior Publication Data
US 2017/0232861 A1    Aug. 17, 2017

(51) Int. Cl.
*B60L 11/18* (2006.01)
*B60L 11/04* (2006.01)
(Continued)

(52) U.S. Cl.
CPC .......... *B60L 11/1851* (2013.01); *B60L 11/04* (2013.01); *H02J 7/0021* (2013.01); *H02J 7/0047* (2013.01);
(Continued)

(58) Field of Classification Search
CPC ........ B60L 3/04; B60L 11/1851; B60L 11/04; B60K 6/22; B60Y 2200/92; B60Y 2400/61; H02M 3/04; H03M 1/12; H03M 1/1215
See application file for complete search history.

(56) References Cited

U.S. PATENT DOCUMENTS

2009/0251103 A1   10/2009   Yamamoto et al.

FOREIGN PATENT DOCUMENTS

| JP | 8-122413 A | 5/1996 |
| JP | 2006-034006 A | 2/2006 |

(Continued)

OTHER PUBLICATIONS

International Search Report of PCT/JP2014/078545, dated Dec. 2, 2014 (PCT/ISA/210).

*Primary Examiner* — Robert Deberadinis
(74) *Attorney, Agent, or Firm* — Sughrue Mion, PLLC; Richard C. Turner (57) ABSTRACT

This in-vehicle DC-DC converter is configured from: a power conversion unit that transmits/receives power between a low-voltage system secondary battery and a high-voltage system secondary battery; low-voltage system AD converters and high-voltage system AD converters, which convert analog values of the currents, voltages, and temperatures of the low-voltage system secondary battery and the high-voltage system secondary battery into digital values; an input switching unit that switches analog values of the high-voltage system secondary battery into analog values of the corresponding low-voltage system secondary battery; and a calculation unit that compares the digital values of the low-voltage system AD converters and the digital values of the high-voltage system AD converters with each other. In the switched state, failure diagnosis of the AD converter is performed by comparing the digital values of (Continued)

the low-voltage system AD converters and the digital values of the high-voltage system AD converters with each other.

14 Claims, 8 Drawing Sheets

(51) Int. Cl.
    *H02M 3/04*     (2006.01)
    *H03M 1/12*     (2006.01)
    *H02J 7/00*     (2006.01)
    *B60L 3/04*     (2006.01)
    *B60K 6/22*     (2007.10)

(52) U.S. Cl.
    CPC ............... *H02M 3/04* (2013.01); *H03M 1/12* (2013.01); *B60K 6/22* (2013.01); *B60Y 2200/92* (2013.01); *B60Y 2400/61* (2013.01); *H03M 1/1215* (2013.01); *Y10S 903/904* (2013.01)

(56) References Cited

FOREIGN PATENT DOCUMENTS

| | | | |
|---|---|---|---|
| JP | 2009-268068 A | 11/2009 | |
| JP | 2010-256634 A | 11/2010 | |
| JP | 2011-146952 A | 7/2011 | |
| JP | 2013-102318 A | 5/2013 | |

IN-VEHICLE DC-DC CONVERTER

CROSS REFERENCE TO RELATED APPLICATIONS

This application is a National Stage of International Application No. PCT/JP2014/078545 filed Oct. 28, 2014, the contents of all of which are incorporated herein by reference.

TECHNICAL FIELD

The present invention relates to an in-vehicle direct current-direct current converter (referred to as "in-vehicle DC-DC converter") having the failure diagnosis function of an analog-digital converter (referred to as "AD converter") that detects states of secondary batteries for use in power sources in the in-vehicle DC-DC converter that performs DC power conversion between a low-voltage system power source and a high-voltage system power source.

BACKGROUND ART

Normally, a vehicle is equipped with a plurality of control devices that are for performing electric power control and/or driving system control of the whole of the vehicle while controlling states of secondary batteries for use in power sources. More particularly, a hybrid vehicle is equipped with a DC-DC converter which is connected between a high-voltage system power source including a high-voltage system secondary battery that supplies electric power to a high-voltage system load and a low-voltage system power source including a low-voltage system secondary battery to which a low-voltage system load is connected, and performs control of transmission/reception of electric power on the basis of information of charge states and load states of the high-voltage system secondary battery and the low-voltage system secondary battery.

So, in order to efficiently perform the control of transmission/reception of electric power between the low-voltage system secondary battery and the high-voltage system secondary battery, for example, a DC-DC converter of Patent Document 1 is provided with a battery monitoring device that monitors voltage states, charge states, and the like of secondary batteries by sensors, the battery monitoring device being provided inside the DC-DC converter, in the transmission/reception of electric power between the secondary batteries, whose role is supported by the DC-DC converter. Output voltage of the DC-DC converter is controlled to be a constant voltage by pulse width modulation (PWM) control on the basis of information from the battery monitoring device.

Furthermore, when AD converters that convert analog signals from various types of sensors into digital signals have failed, a state detection device of a secondary battery, whose voltage source is the secondary battery, calculates a state of charge of the secondary battery on the basis of an unauthorized output from the AD converters; and accordingly, the state of charge of the secondary battery cannot be accurately calculated. Thus, in the case of being used continuously in a state where the AD converters have failed, it may not be possible to start an engine due to deterioration and/or over-discharge of the secondary battery. Further, it becomes an output voltage of the DC-DC converter which is different from control intention, and accordingly it may not be possible to efficiently transmit/receive electric power between a high-voltage system secondary battery and a low-voltage system secondary battery. As countermeasures against this, for example, in a failure diagnosis method that is for a state detection device of a secondary battery of Patent Document 2, the state detection device of the secondary battery, which has a plurality of AD converters that convert analog values from sensors that detect states of the secondary battery into digital values, includes a calculation unit that mutually compares failure diagnosis voltages to be inputted to the plurality of AD converters with output values of the plurality of AD converters to perform failure determination of the AD converters. This proposes a method of accurately performing failure diagnosis of the AD converters even when the failure diagnosis voltages fluctuate.

PRIOR ART DOCUMENT

Patent Document

Patent Document 1: JP2006-34006A
Patent Document 2: JP2013-102318A

SUMMARY OF THE INVENTION

Problems to be Solved by the Invention

In the case of newly constituting a DC-DC converter by combining the DC-DC converter provided with the battery monitoring device that monitors the states of the secondary batteries of Patent Document 1 with the failure diagnosis function of the AD converters of Patent Document 2, when failure diagnosis of the AD converters is performed, analog values of each parameter of current, voltage, and temperature of the secondary batteries, the analog values being served as input signals to the AD converters, are used as failure diagnosis voltages and the analog values are compared with converted digital values, thereby allowing to perform failure diagnosis even about the AD converters of the DC-DC converter. However, a problem exists in that, each parameter of the current, the voltage, and the temperature cannot be monitored during the failure diagnosis and the calculation accuracy of a state of charge (referred to as "SOC") of each secondary battery deteriorates. Furthermore, an input switching unit is needed for each of the AD converters of the high-voltage system secondary battery and the low-voltage system secondary battery. Accordingly, a problem exists in that the number of the input switching units to be required is increased, its configuration becomes complicated, and its cost is also increased.

The present invention has been made to solve the above described problem, and an object of the present invention is to provide an in-vehicle DC-DC converter that can perform both of the continuation of monitoring of states of secondary batteries and failure diagnosis of AD converters even during the failure diagnosis of the AD converters.

Means for Solving the Problems

In order to solve the above described problem, according to the present invention, there is provided an in-vehicle DC-DC converter including: an electric power converting circuitry that transmits/receives electric power between a first secondary battery and a second secondary battery; a first AD converter that converts at least one of analog values in current, voltage, and temperature of the first secondary battery into a digital value; a second AD converter that converts at least one of analog values in current, voltage, and temperature of the second secondary battery into a digital value; an input switching circuitry unit that switches the analog value of the second secondary battery to the corresponding analog value of the first secondary battery at an input portion of the second AD converter; and a calculating circuitry that compares the corresponding digital value of the first AD converter with the digital value of the second AD converter. In the in-vehicle DC-DC converter, the analog value of the first secondary battery is inputted to the second AD converter by the input switching circuitry and the digital value of the second AD converter is compared with the digital value of the first AD converter by the calculating circuitry, whereby failure diagnosis of the first and the second AD converters is performed.

Furthermore, according to the present invention, there is provided an in-vehicle DC-DC converter including: an electric power converting circuitry that transmits/receives electric power between a first secondary battery and a second secondary battery; a first AD converter that converts at least one of analog values in current, voltage, and temperature of the first secondary battery into a digital value; a second AD converter that converts at least one of analog values in current, voltage, and temperature of the second secondary battery into a digital value; an input switching circuitry that switches the analog value of the first secondary battery to the corresponding analog value of the second secondary battery at an input portion of the first AD converter; and a calculating circuitry that compares the corresponding digital value of the first AD converter with the digital value of the second AD converter. In the in-vehicle DC-DC converter, the analog value of the second secondary battery is inputted to the first AD converter by the input switching circuitry and the digital value of the second AD converter is compared with the digital value of the first AD converter by the calculating circuitry, whereby failure diagnosis of the first and the second AD converters is performed.

Advantageous Effect of the Invention

According to an in-vehicle DC-DC converter of the present invention, either AD converter of a high-voltage system secondary battery or a low-voltage system secondary battery is used for failure diagnosis, whereby an effect exists in that both of the continuation of monitoring of the other secondary battery and failure diagnosis of AD converters can be performed.

MODE FOR CARRYING OUT THE INVENTION

Embodiment 1

Figure 1:
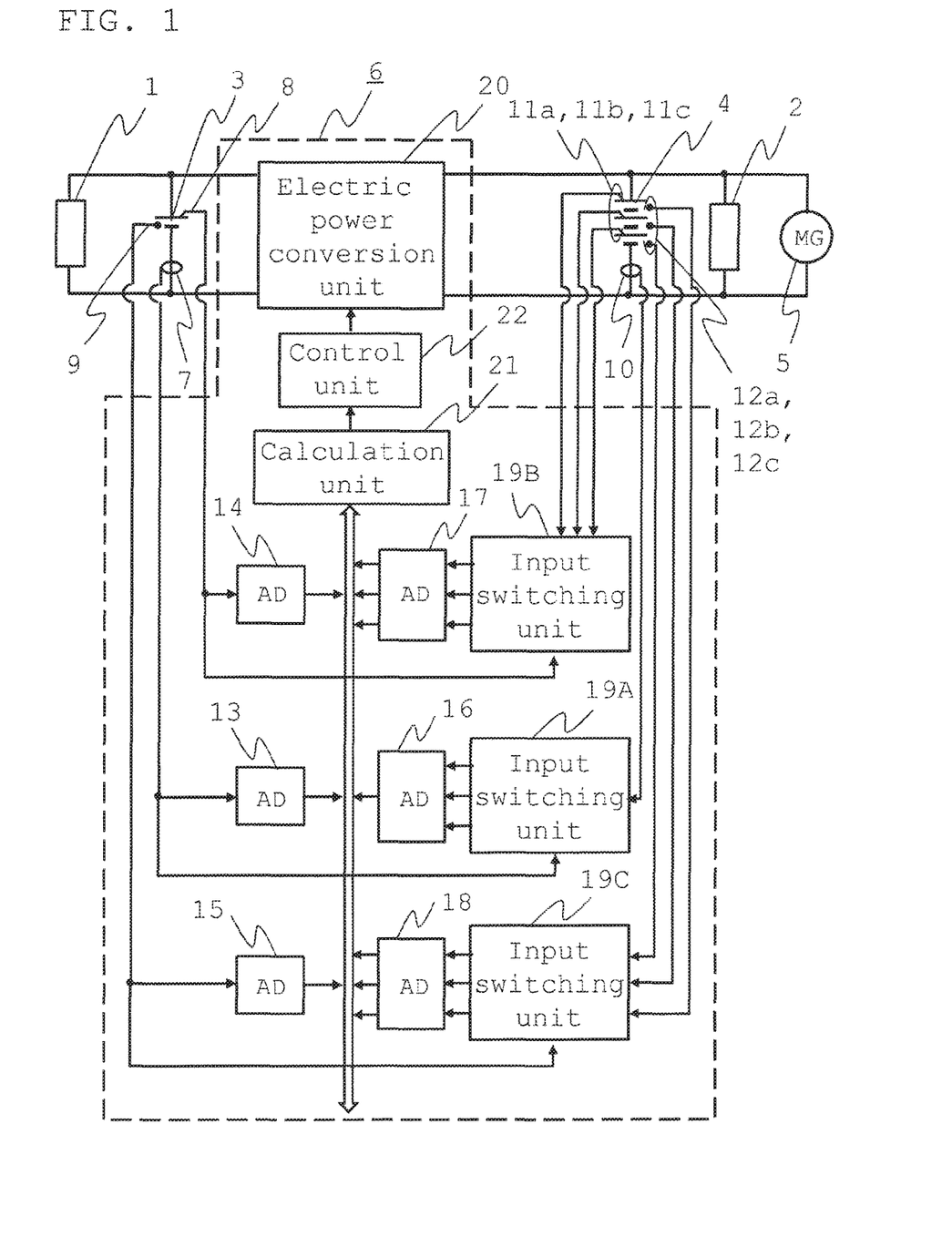
FIG. 1 is a configuration diagram showing an outline of an electric power conversion system including an in-vehicle DC-DC converter according to Embodiment 1.
Figure 2:
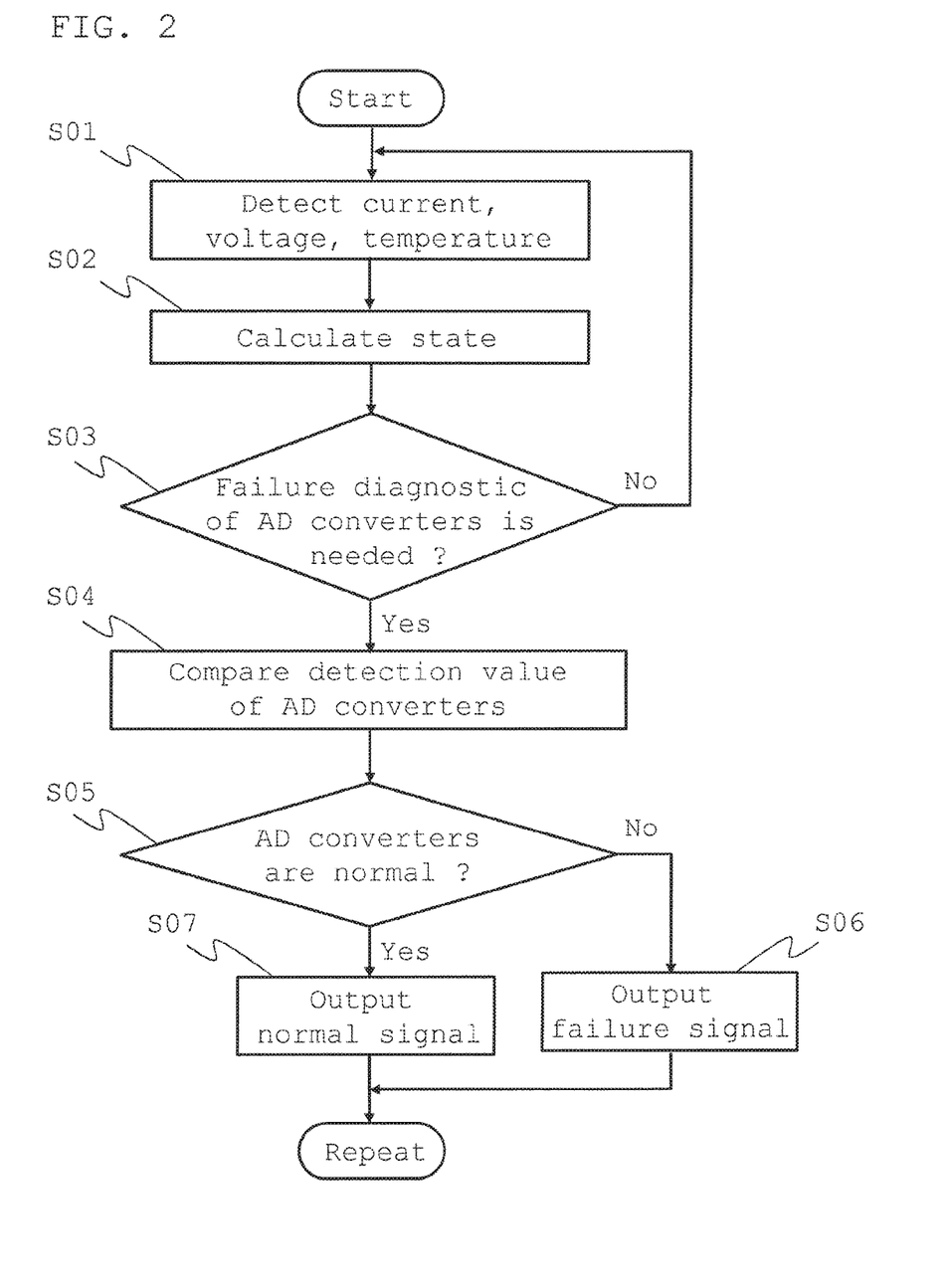
FIG. 2 is a chart showing procedures for failure diagnosis processing of AD converters of the in-vehicle DC-DC converter in Embodiment 1.

FIG. 1 is a configuration diagram showing an outline of an electric power conversion system including an in-vehicle DC-DC converter according to Embodiment 1; and FIG. 2 is a chart showing procedures for failure diagnosis processing of AD converters.

First, the schematic configuration of the electric power conversion system including the in-vehicle DC-DC converter having the failure diagnosis function of the AD converters according to Embodiment 1 will be described by using FIG. 1.

As shown in FIG. 1, an in-vehicle DC-DC converter 6 according to Embodiment 1 includes: an electric power conversion unit 20 which is connected between a low-voltage system secondary battery 3 serving as a first secondary battery that supplies electric power to a low-voltage system load 1 serving as a first load and a high-voltage system secondary battery 4 serving as a second secondary battery that supplies electric power to a high-voltage system load 2 serving as a second load, and mutually transmits/receives electric power; a low-voltage system AD converter 13 that converts an analog value from a current sensor 7 that detects current of the low-voltage system secondary battery 3 into a digital value; a low-voltage system AD converter 14 that converts an analog value from a voltage sensor 8 that detects voltage of the low-voltage system secondary battery 3 into a digital value; a low-voltage system AD converter 15 that converts an analog value from a temperature sensor 9 that detects temperature of the low-voltage system secondary battery 3 into a digital value; a high-voltage system AD converter 16 that converts an analog value from a current sensor 10 that detects current of a high-voltage system secondary battery 4 into a digital value; a high-voltage system AD converter 17 that converts an analog value from each voltage sensor 11a, 11b, 11c that detects voltage of each cell of the high-voltage system secondary battery 4 into a digital value; a high-voltage system AD converter 18 that converts an analog value from each temperature sensor 12a, 12b, 12c that detects temperature of each cell of the high-voltage system secondary battery 4 into a digital value; an input switching unit 19A which is provided at an input portion of the high-voltage system AD converter 16 and switches the analog value from the current sensor 10 that detects the current of the high-voltage system secondary battery 4 to the analog value from the current sensor 7 that detects the current of the low-voltage system secondary battery 3 during failure diagnosis; an input switching unit 19B which is provided at an input portion of the high-voltage system AD converter 17 and switches the analog value from each voltage sensor 11a, 11b, 11c that detects the voltage of each cell that constitutes the high-voltage system secondary battery 4 to the analog value from the voltage sensor 8 that detects the voltage of the low-voltage system secondary battery 3 during failure diagnosis; an input switching unit 19C which is provided at an input portion of the high-voltage system AD converter 18 and switches the analog value from each temperature sensor 12a, 12b, 12c that detects the temperature of each cell that constitutes the high-voltage system secondary battery 4 to the analog value from the temperature sensor 9 that detects the temperature of the low-voltage system secondary battery 3 during failure diagnosis; a calculation unit 21 that calculates output voltage of the electric power conversion unit 20 and states of the low-voltage system secondary battery 3 and the high-voltage system secondary battery 4 on the basis of the digital values outputted from the low-voltage system AD converters 13, 14, 15 and the high-voltage system AD converters 16, 17, 18; and a control unit 22 that controls the electric power conversion unit 20 on the basis of an output signal from the calculation unit 21.

Here, a generator motor 5 is connected on the output side of the high-voltage system secondary battery 4 and is coupled to an internal combustion engine. Furthermore, each interface circuit is provided: between the current sensor 7 and the low-voltage system AD converter 13; between the current sensor 7 and the input switching unit 19A; between the voltage sensor 8 and the low-voltage system AD converter 14; between the voltage sensor 8 and the input switching unit 19B; between the temperature sensor 9 and the low-voltage system AD converter 15; and between the temperature sensor 9 and the input switching unit 19C. However each interface circuit is omitted in FIG. 1.

Next, the point of performing failure diagnosis of the AD converters will be described. When the failure diagnosis is performed, the control unit 22 operates the input switching units 19A, 19B, 19C to switch so that the analog values outputted from the current sensor 7, the voltage sensor 8, and the temperature sensor 9 which detect the states (current, voltage, temperature) of the low-voltage system secondary battery 3 are inputted to the high-voltage system AD converters 16, 17, 18; and the digital values outputted from the high-voltage system AD converters 16, 17, 18 and the digital values outputted from the low-voltage system AD converters 13, 14, 15 are mutually compared with each other by the calculation unit 21, whereby the failure diagnosis of the AD converters related to each of the currents, the voltages, and the temperatures is performed. The failure diagnosis results are outputted to the control unit 22. In this regard, however, it cannot be distinguished by the failure diagnosis results as to whether the failure of the low-voltage system AD converters has occurred or the failure of the high-voltage system AD converters has occurred.

Next, procedures for failure diagnosis processing of the AD converters will be specifically described by using FIG. 2.

First, in the process of Step S01, the states of the low-voltage system secondary battery 3 and the high-voltage system secondary battery 4 are detected by the current sensors 7, 10, the voltage sensors 8, 11a, 11b, 11c, and the temperature sensors 9, 12a, 12b, 12c; and their analog values are converted into the digital values by the low-voltage system AD converters 13, 14, 15 and the high-voltage system AD converters 16, 17, 18, respectively.

Next, in the process of Step S02, the output voltage of the electric power conversion unit 20 and the states (current, voltage, temperature) of the low-voltage system secondary battery 3 and the high-voltage system secondary battery 4 are calculated by the calculation unit 21 on the basis of these digital values.

In the process of Step S03, the control unit 22 determines the necessity of the failure diagnosis of the AD converters. The failure diagnosis processing of the AD converters is performed at a specified time interval Δt (for example, an interval of 5 to 10 min or the like) in starting of the internal combustion engine and in operating of the internal combustion engine. When the failure diagnosis is determined to be needed, the process proceeds to the process of next Step S04; and when the failure diagnosis is determined not to be needed, the process returns to the process of Step S01.

In the process of Step S04, the control unit 22 operates the input switching units 19A, 19B, 19C to switch the analog values to be inputted to the high-voltage system AD converters 16, 17, 18 to the analog values from the current sensor 7, the voltage sensor 8, and the temperature sensor 9 which detect the states of the low-voltage system secondary battery 3. This inputs the analog values from the low voltage system sensors of the same parameters (current, voltage, temperature) as the low-voltage system AD converters 13, 14, 15, to the high-voltage system AD converters 16, 17, 18. Furthermore, when a plurality of cells of the high-voltage system secondary battery 4 are provided and the high-voltage system AD converters are prepared correspondingly, the input switching units 19A, 19B, 19C are switched so that the input is performed to all the high-voltage system AD converters at the same time. After this, by the calculation unit 21, the digital value of the low-voltage system AD converter 13 connected to the current sensor 7 is compared with the digital value of the high-voltage system AD converter 16 connected to the current sensor 7 via the input switching unit 19A, the digital value of the low-voltage system AD converter 14 connected to the voltage sensor 8 is compared with the digital value of the high-voltage system AD converter 17 connected to the voltage sensor 8 via the input switching unit 19B, and the digital value of the low-voltage system AD converter 15 connected to the temperature sensor 9 is compared with the digital value of the high-voltage system AD converter 18 connected to the temperature sensor 9 via the input switching unit 19C.

In the process of Step S05, when any of the digital values of the parameters compared by the calculation unit 21 is not conformed in the process of Step S04, the AD converter (either the low-voltage system AD converters or the high-voltage system AD converters) corresponding to the unconformable parameter is determined to have failed; and the process shifts to the process of Step S06. Then, when the digital values of the compared parameters are conformed, the AD converters are determined to be normal; and the process shifts to the process of Step S07.

In the process of Step S06, the calculation unit 21 outputs a failure signal, which shows the AD converter of any of the current, the voltage, and the temperature has failed, to the control unit 22.

In the process of Step S07, the calculation unit 21 outputs a normal signal, which shows the AD converter of any of the current, the voltage, and the temperature has not failed, to the control unit 22.

If the failure diagnosis is finished, the control unit 22 returns the input switching units 19A, 19B, 19C to a state in the normal time. More specifically, the control unit 22 switches so that the analog values outputted from the current sensor 7, the voltage sensor 8, and the temperature sensor 9 which detect the parameters (current, voltage, temperature) of the states of the high-voltage system secondary battery 4 are inputted to the high-voltage system AD converters 16, 17, 18.

Furthermore, in the process of Step S02, the electric power conversion unit 20 transmits/receives electric power on the basis of the calculated output voltage; however, if a table that defines the relationship, in which conversion efficiency of electric power transmission/reception becomes optimum, between a voltage value of the high-voltage system secondary battery 4 and a current value of the low-voltage system secondary battery 3 is stored in a storing unit (not shown in the drawing), the voltage of the low-voltage system secondary battery is obtained on the basis of the digital state value of the low-voltage system secondary battery 3 and the voltage value of the high-voltage system secondary battery 4 can be commanded to the electric power conversion unit 20 from the voltage value of the low-voltage system secondary battery 3 in accordance with the table so as to be a current value of the high-voltage system secondary battery 4, in which the conversion efficiency of electric power transmission/reception becomes optimum, even during the failure diagnosis of the AD converters by the present invention.

In this way, during the failure diagnosis, the AD converter (here, the low-voltage system secondary battery) in which the input is not switched can continuously monitor the parameters (current, voltage, temperature) of the states of the low-voltage system secondary battery even during the failure diagnosis; and therefore, the electric power conversion unit can efficiently transmit/receive electric power on the basis of an input voltage from the low-voltage system secondary battery. Furthermore, accurate calculation of SOC is made possible. Moreover, the input switching units are arranged on only the high-voltage system AD converters (not necessary for the low voltage system), whereby the failure diagnosis of the AD converters is made possible and a reduction in costs is made possible.

As described above, according to the in-vehicle DC-DC converter according to Embodiment 1, the AD converters that monitor the states of the high-voltage system secondary battery and the low-voltage system secondary battery are provided; the input values of the high-voltage system AD converters are switched to the input values from the sensors of the low-voltage system secondary battery and the output values of the low-voltage system AD converters are compared with the output values of the high-voltage system AD converter, thereby performing the failure diagnosis of the AD converters; and therefore, an effect exists in that both of the continuation of monitoring of the states of the low-voltage system secondary battery and the failure diagnosis of the AD converters can be performed.

Embodiment 2

Figure 3:
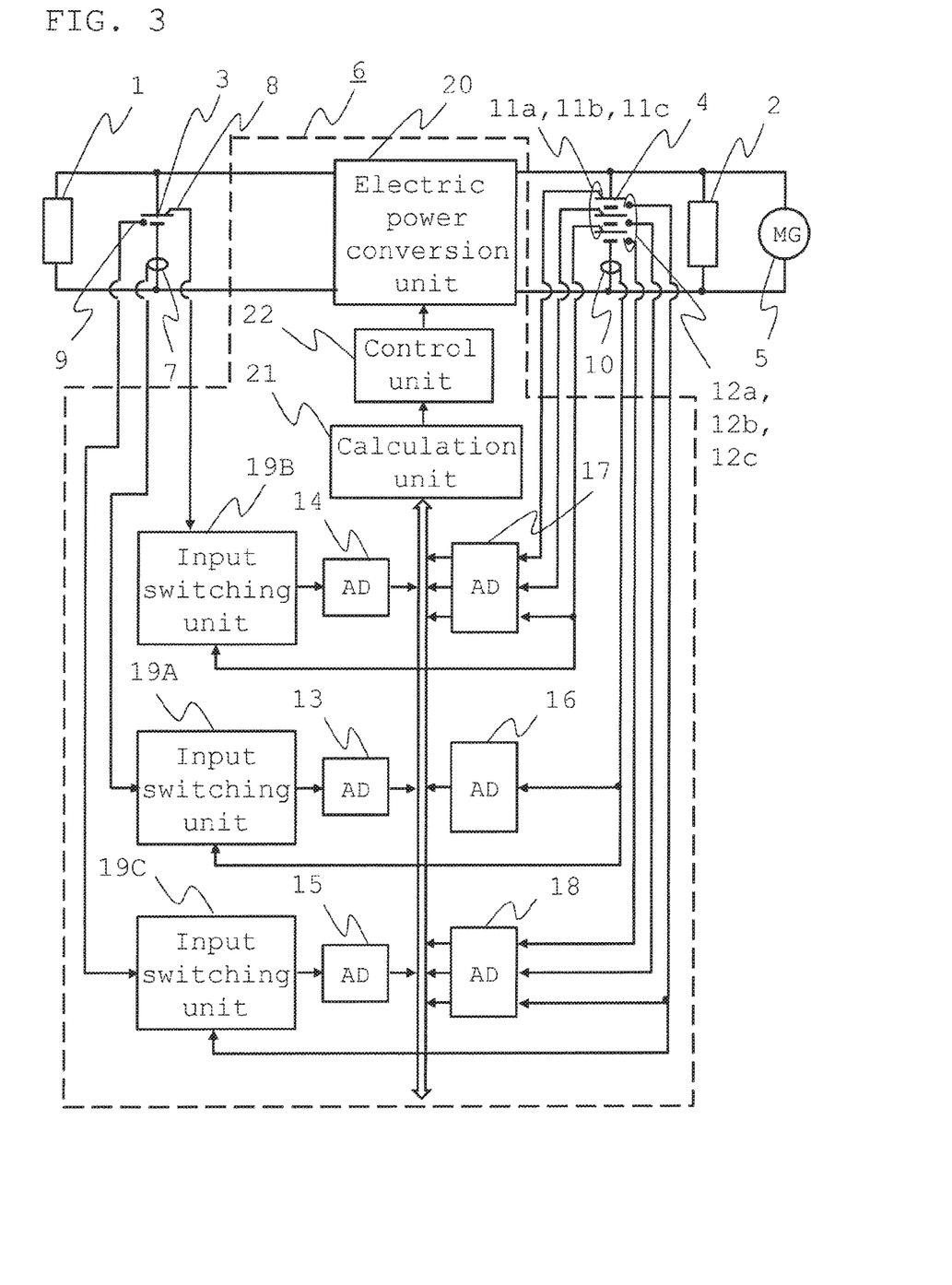
FIG. 3 is a configuration diagram showing an outline of an electric power conversion system including an in-vehicle DC-DC converter according to Embodiment 2.

FIG. 3 is a configuration diagram showing an outline of an electric power conversion system including an in-vehicle DC-DC converter according to Embodiment 2. A different point from the in-vehicle DC-DC converter according to Embodiment 1 is that an input switching unit is placed at a low-voltage system AD converter.

First, the schematic configuration of the electric power conversion system including the in-vehicle DC-DC converter having the failure diagnosis function of the AD converters according to Embodiment 2 will be described by using FIG. 3.

As shown in FIG. 3, an in-vehicle DC-DC converter 6 according to Embodiment 2 includes: an electric power conversion unit 20 which is connected between a low-voltage system secondary battery 3 that supplies electric power to a low-voltage system load 1 and a high-voltage system secondary battery 4 that supplies electric power to a high-voltage system load 2, and mutually transmits/receives electric power; a low-voltage system AD converter 13 that converts an analog value from a current sensor 7 that detects current of the low-voltage system secondary battery 3 into a digital value; a low-voltage system AD converter 14 that converts an analog value from a voltage sensor 8 that detects voltage of the low-voltage system secondary battery 3 into a digital value; a low-voltage system AD converter 15 that converts an analog value from a temperature sensor 9 that detects temperature of the low-voltage system secondary battery 3 into a digital value; a high-voltage system AD converter 16 that converts an analog value from a current sensor 10 that detects current of the high-voltage system secondary battery 4 into a digital value; a high-voltage system AD converter 17 that converts an analog value from each voltage sensor 11a, 11b, 11c that detects voltage of each cell of the high-voltage system secondary battery 4 into a digital value; a high-voltage system AD converter 18 that converts an analog value from each temperature sensor 12a, 12b, 12c that detects temperature of each cell of the high-voltage system secondary battery 4 into a digital value; an input switching unit 19A which is provided at an input portion of the low-voltage system AD converter 13 and switches the analog value from the current sensor 7 that detects the current of the low-voltage system secondary battery 3 to the analog value from the current sensor 10 that detects the current of the high-voltage system secondary battery 4 during failure diagnosis; an input switching unit 19B which is provided at an input portion of the low-voltage system AD converter 14 and switches the analog value from the voltage sensor 8 that detects the voltage of the low-voltage system secondary battery 3 to any one of the analog values from voltage sensors 11a, 11b, 11c that detect the voltage of each cell that constitutes the high-voltage system secondary battery 4 during failure diagnosis; an input switching unit 19C which is provided at an input portion of the low-voltage system AD converter 15 and switches the analog value from the temperature sensor 9 that detects the temperature of the low-voltage system secondary battery 3 to any one of the analog values from temperature sensors 12a, 12b, 12c that detect the temperature of each cell that constitutes the high-voltage system secondary battery 4 during failure diagnosis; a calculation unit 21 that calculates output voltage of the electric power conversion unit 20 and states of the low-voltage system secondary battery 3 and the high-voltage system secondary battery 4 on the basis of the digital values outputted from the low-voltage system AD converters 13, 14, 15 and the high-voltage system AD converters 16, 17, 18; and a control unit 22 that controls the electric power conversion unit 20 on the basis of an output signal from the calculation unit 21. Other constituent elements are the same as Embodiment 1 and therefore their description will be omitted.

Here, a generator motor 5 is connected on the output side of the high-voltage system secondary battery 4 and is coupled to an internal combustion engine. Furthermore, each interface circuit is provided: between the current sensor 10 and the high-voltage system AD converter 16; between the current sensor 10 and the input switching unit 19A; between each of the voltage sensors 11a, 11b, 11c and the high-voltage system AD converter 17; between each of the voltage sensors 11a, 11b, 11c and the input switching unit 19B; between each of the temperature sensors 12a, 12b, 12c and the high-voltage system AD converter 18; and between each of the temperature sensors 12a, 12b, 12c and the input switching unit 19C. However each interface circuit is omitted in FIG. 3.

Next, the point of failure diagnosis processing of the AD converters will be described. When the failure diagnosis is performed, the control unit 22 operates the input switching units 19A, 19B, 19C to switch so that the analog values outputted from the current sensor 10, the voltage sensors 11a, 11b, 11c, and the temperature sensors 12a, 12b, 12c which detect the states (current, voltage, temperature) of the high-voltage system secondary battery 4 are inputted to the low-voltage system AD converters 16, 17, 18; and the digital values outputted from the low-voltage system AD converters 13, 14, 15 are compared with the digital values outputted from the high-voltage system AD converter 16, 17, 18 by the calculation unit 21, whereby the failure diagnosis of the AD converters related to each of the currents, the voltages, and the temperatures is performed. The failure diagnosis results are outputted to the control unit 22. In this regard, however, it cannot be distinguished by the failure diagnosis results as to whether the failure of the low-voltage system AD converters has occurred or the failure of the high-voltage system AD converters has occurred.

Procedures for the failure diagnosis processing of the AD converters in Embodiment 2 are the same as the procedures shown in FIG. 2 of Embodiment 1 except for that the input switching units 19A, 19B, 19C are provided on the low-voltage system AD converter sides; and therefore, their description will be omitted.

As described above, according to the in-vehicle DC-DC converter according to Embodiment 2, the AD converters that monitor the states of the high-voltage system secondary battery and the low-voltage system secondary battery are provided; the input values of the low-voltage system AD converters are switched to the input values from the sensors of the high-voltage system secondary battery and the output values of the low-voltage system AD converters are compared with the output values of the high-voltage system AD converters, thereby performing the failure diagnosis of the AD converters; and therefore, an effect exists in that both of the continuation of monitoring of the states of the high-voltage system secondary battery and the failure diagnosis of the AD converters can be performed.

Embodiment 3

Figure 4:
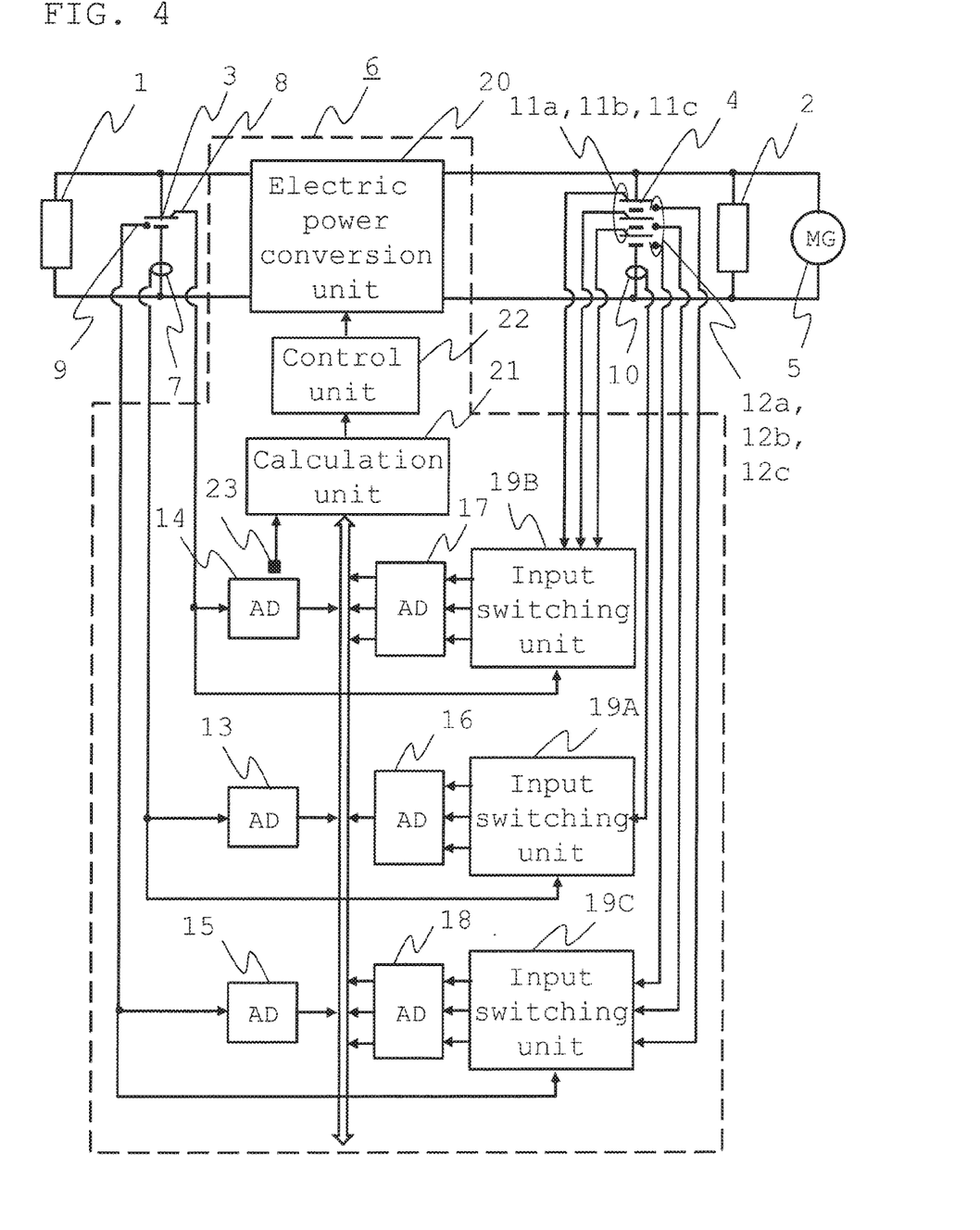
FIG. 4 is a configuration diagram showing an outline of an electric power conversion system including an in-vehicle DC-DC converter according to Embodiment 3.
Figure 5:
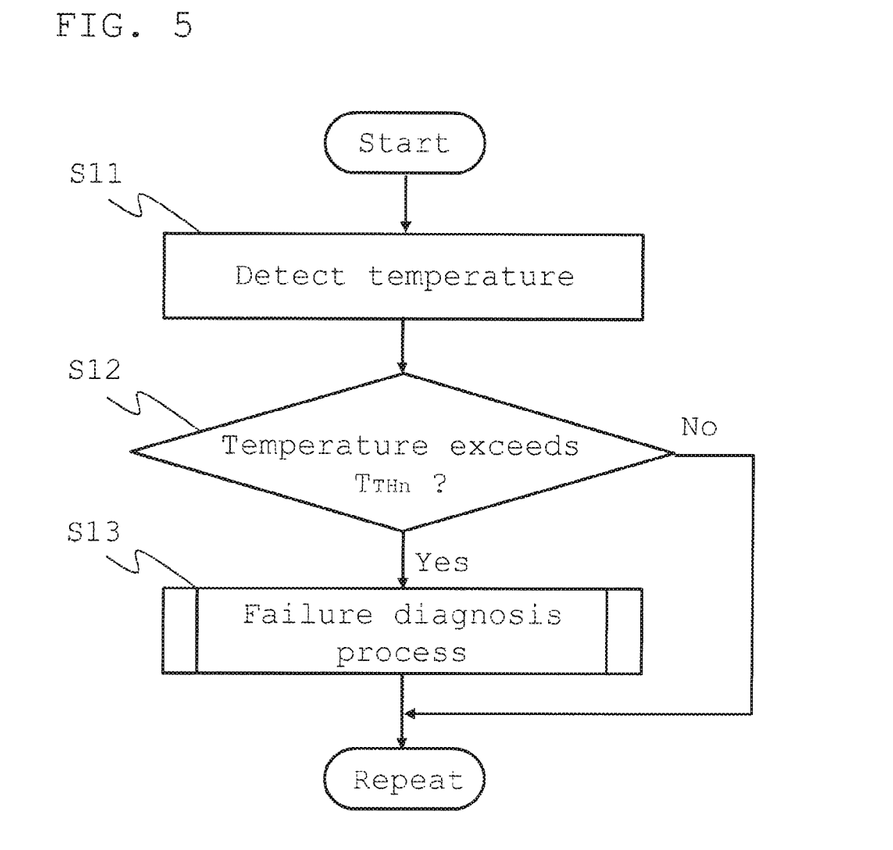
FIG. 5 is a chart showing procedures that determine the necessity of failure diagnosis processing of AD converters in Embodiment 3.
Figure 6:
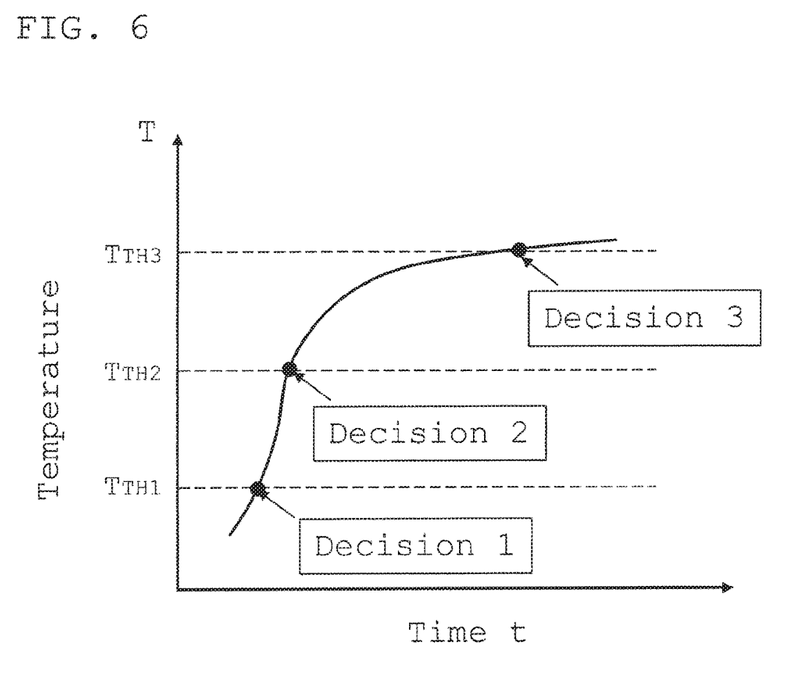
FIG. 6 is a view for explaining determination temperature of the failure diagnosis processing of the AD converter in Embodiment 3.

FIG. 4 is a configuration diagram showing an outline of an electric power conversion system including an in-vehicle DC-DC converter according to Embodiment 3; and FIG. 5 is a chart showing procedures that determine the necessity of failure diagnosis processing of AD converters. FIG. 6 is a view for explaining determination temperature by which the necessity of the failure diagnosis processing of the AD converter is determined. A different point from the in-vehicle DC-DC converter according to Embodiment 1 is that a temperature sensor is placed on the AD converter and the failure diagnosis processing of the AD converter is determined on the basis of the temperature of the AD converter.

As shown in FIG. 4, in an in-vehicle DC-DC converter 6 according to Embodiment 3, a temperature sensor 23 is placed on a low-voltage system AD converter 14 and detected temperature is inputted to a calculation unit 21. Other constituent elements are the same as Embodiment 1 and therefore their description will be omitted.

Next, procedures for the failure diagnosis processing of the AD converter will be specifically described by using FIG. 5. The failure diagnosis processing of the AD converters in Embodiment 1 is performed at a specified time interval; however, the failure diagnosis processing is performed on the basis of the temperature of the AD converter in Embodiment 3.

First, in the process of Step S11, the temperature of the low-voltage system AD converter 14 is detected by the temperature sensor 23 and detected temperature T is inputted to the calculation unit 21.

Next, in the process of Step S12, the detected temperature T is compared with preliminarily set determination temperature $T_{THn}$ (where, n=1, 2, 3, . . . ) in the calculation unit 21; and when T exceeds $T_{THn}$, the process shifts to Step S13. When T does not exceed $T_{THn}$, the process skips the process of Step S13. As an example, FIG. 6 shows the relationship about a vehicle running time, a change in temperature of the AD converter, and the determination temperature. Here, for example, $T_{TH1}$ is set to determination temperature at which a stable state from starting of an internal combustion engine is assumed; $T_{TH2}$ is set to diagnosis temperature at which a running state in an urban district or the like is assumed; and $T_{TH3}$ is set to determination temperature at which a high speed running state in an expressway or the like is assumed.

In the process of Step S13, the failure diagnosis processing of the AD converter is performed; however, as for its procedures, the processing that is the same as the processes of Step S04 to Step S07 described in the procedures for the failure diagnosis processing of the AD converters of Embodiment 1 shown in FIG. 2 is performed. The processing is the same as FIG. 2 and therefore its description will be omitted.

Figure 7:
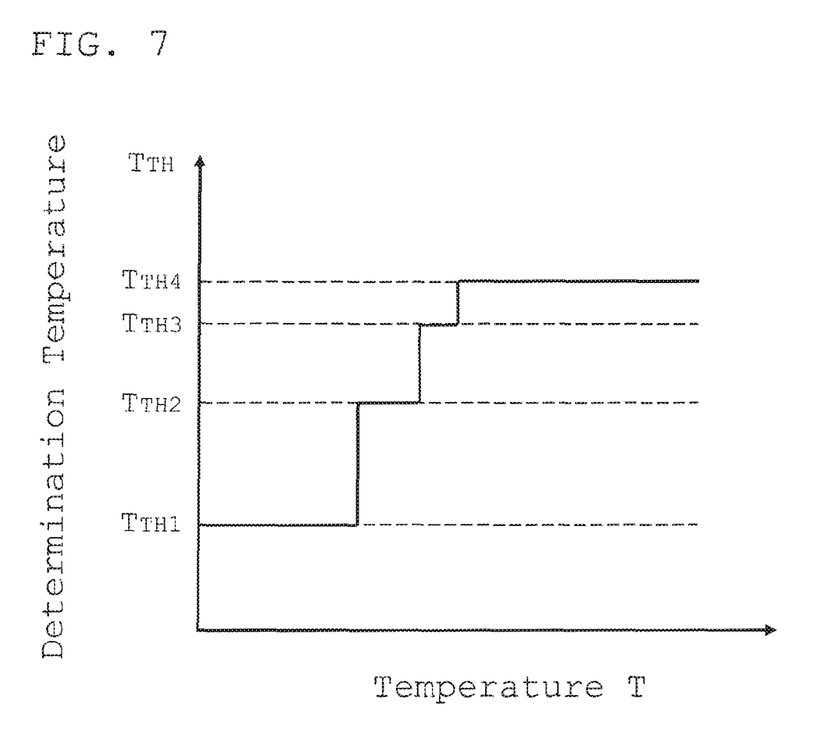
FIG. 7 is a view showing an example of the relationship between temperature of the AD converter and determination temperature in Embodiment 3.

A semiconductor element for use in the in-vehicle DC-DC converter including the AD converter tends to increase a failure rate with an increase in temperature and therefore the failure diagnosis by the temperature of the AD converter is important. Thus, as shown in FIG. 7, an interval of determination temperature $T_{TH}$ may be set to be narrower with an increase in temperature of the AD converter. This allows to find a failure early during high temperature and it is preferable for the failure diagnosis of the AD converter.

Incidentally, the description has been made on the case where the temperature sensor 23 is placed on the low-voltage system AD converter 14 in this embodiment; however, placing on other AD converter or a plurality of AD converters is permissible.

Furthermore, the determination temperature may be set and/or changed on the basis of atmospheric temperature. More particularly, since the determination temperature is influenced by the atmospheric temperature in starting of the internal combustion engine, the determination temperature $T_{TH}$ on the low temperature side is preferable to be changed in accordance with the atmospheric temperature.

As described above, according to the in-vehicle DC-DC converter according to Embodiment 3, when the temperature sensor is placed on the AD converter and the detected temperature exceeds the determination temperature $T_{TH}$, the failure diagnosis of the AD converter is performed; and therefore, as in Embodiment 1, an effect exists in that both of the continuation of monitoring of the high-voltage system secondary battery and the failure diagnosis of the AD converter can be performed and an effect exists in that the failure diagnosis by the temperature of the AD converter can be accurately performed.

Figure 8:
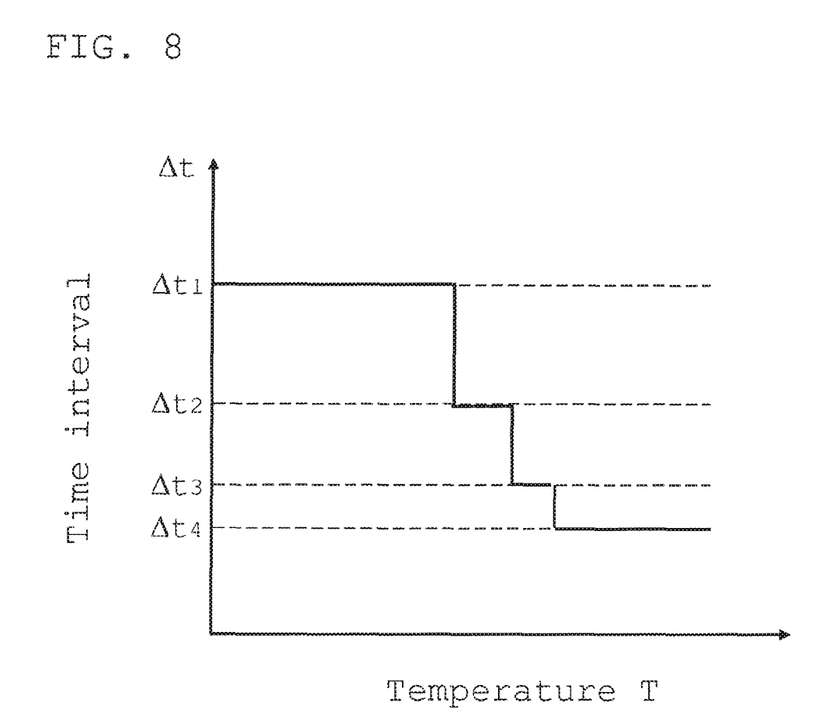
FIG. 8 is a view showing an example of the relationship between temperature of an AD converter and time interval in other embodiment.

Incidentally, in the aforementioned Embodiments 1 and 2, the description has been made on the case where the failure diagnosis at a constant time interval is performed; however, as shown in FIG. 8, the failure diagnosis may be performed at a shorter time interval Δtn with an increase in its temperature by utilizing the detected temperature of the AD converter.

Furthermore, the failure diagnosis by the time interval of Embodiment 1 may be used together with the failure diagnosis by the temperature of the AD converter of Embodiment 3.

Moreover, in embodiments, the description has been made on the case where the electric power conversion unit supplies electric power from the low-voltage system secondary battery to the high-voltage system secondary battery; however, regardless of this, a step-up voltage and/or a step-down voltage may be transmitted, or electric power may be bi-directionally transmitted/received.

In addition, in the aforementioned embodiments, the description has been made on the example of the in-vehicle DC-DC converter that performs electric power conversion by using the secondary batteries; however, voltage sources that do not use the secondary batteries may be permissible.

Additionally, the present invention can freely combine the respective embodiments and appropriately modify and/or omit the respective embodiments, within the scope of the present invention.

Besides, the same reference numerals as those shown in the drawings represent identical or corresponding elements.

DESCRIPTION OF REFERENCE NUMERALS

1 Low-voltage system load, 2 High-voltage system load, 3 Low-voltage system secondary battery, 4 High-voltage system secondary battery, 5 Generator motor, 6 DC-DC converter, 7, 10 Current sensor, 8, 11a, 11b, 11c Voltage sensor, 9, 12a, 12b, 12c Temperature sensor, 13, 14, 15 Low-voltage system AD converter, 16, 17, 18 High-voltage system AD converter, 19A, 19B, 19C Input switching unit, 20 Electric power conversion unit, 21 Calculation unit, 22 Control unit, 23 Temperature sensor.

What is claimed is:

1. An in-vehicle DC-DC converter comprising:
an electric power converting circuitry that transmits/receives electric power between a first secondary battery and a second secondary battery;
a first AD converter that converts at least one of analog values in current, voltage, and temperature of said first secondary battery into a digital value;
a second AD converter that converts at least one of analog values in current, voltage, and temperature of said second secondary battery into a digital value;
an input switching circuitry that switches the analog value of said second secondary battery to the corresponding analog value of said first secondary battery at an input portion of said second AD converter; and
a calculating circuitry that compares the corresponding digital value of said first AD converter with the digital value of said second AD converter,
wherein the analog value of said first secondary battery is inputted to said second AD converter by said input switching circuitry and the digital value of said second AD converter is compared with the digital value of said first AD converter by said calculating circuitry, whereby failure diagnosis of said first and said second AD converters is performed.

2. The in-vehicle DC-DC converter according to claim 1 wherein the failure diagnosis is performed at a specified time interval.

3. The in-vehicle DC-DC converter according to claim 2 wherein the specified time interval is set to be narrower with an increase in temperature.

4. The in-vehicle DC-DC converter according to claim 1 wherein when at least one of said first and said second AD converters is provided with a temperature sensor and temperature of said temperature sensor exceeds determination temperature, the failure diagnosis is performed.

5. The in-vehicle DC-DC converter according to claim 4, wherein the determination temperature is set on the basis of atmospheric temperature.

6. The in-vehicle DC-DC converter according to claim 4, wherein the determination temperature is set to be narrower with an increase in temperature.

7. The in-vehicle DC-DC converter according to claim 5, wherein the determination temperature is set to be narrower with an increase in temperature.

8. An in-vehicle DC-DC converter comprising:
an electric power converting circuitry that transmits/receives electric power between a first secondary battery and a second secondary battery;
a first AD converter that converts at least one of analog values in current, voltage, and temperature of said first secondary battery into a digital value;
a second AD converter that converts at least one of analog values in current, voltage, and temperature of said second secondary battery into a digital value;
an input switching circuitry that switches the analog value of said first secondary battery to the corresponding analog value of said second secondary battery at an input portion of said first AD converter; and
a calculating circuitry that compares the corresponding digital value of said first AD converter with the digital value of said second AD converter,
wherein the analog value of said second secondary battery is inputted to said first AD converter by said input switching circuitry and the digital value of said second AD converter is compared with the digital value of said first AD converter by said calculating circuitry, whereby failure diagnosis of said first and said second AD converters is performed.

9. The in-vehicle DC-DC converter according to claim 8, wherein the failure diagnosis is performed at a specified time interval.

10. The in-vehicle DC-DC converter according to claim 9, wherein the specified time interval is set to be narrower with an increase in temperature.

11. The in-vehicle DC-DC converter according to claim 8, wherein when at least one of said first and said second AD converters is provided with a temperature sensor and temperature of said temperature sensor exceeds determination temperature, the failure diagnosis is performed.

12. The in-vehicle DC-DC converter according to claim 11, wherein the determination temperature is set on the basis of atmospheric temperature.

13. The in-vehicle DC-DC converter according to claim 11, wherein the determination temperature is set to be narrower with an increase in temperature.

14. The in-vehicle DC-DC converter according to claim 12, wherein the determination temperature is set to be narrower with an increase in temperature.

* * * * *